United States Patent [19]

Okabe et al.

[11] Patent Number: 5,663,096

[45] Date of Patent: Sep. 2, 1997

[54] METHOD OF MANUFACTURING A VERTICAL SEMICONDUCTOR DEVICE WITH GROUND SURFACE PROVIDING A REDUCED ON RESISTANCE

[75] Inventors: Yoshifumi Okabe, Nagoya; Masami Yamaoka, Anjo; Akira Kuroyanagi, Okazaki, all of Japan

[73] Assignee: Nippondenso Co., Ltd., Kariya, Japan

[21] Appl. No.: 473,775

[22] Filed: Jun. 6, 1995

Related U.S. Application Data

[62] Division of Ser. No. 409,900, Mar. 22, 1995, which is a continuation of Ser. No. 953,766, Sep. 30, 1992, abandoned, which is a division of Ser. No. 652,920, Feb. 8, 1991, Pat. No. 5,242,862.

[30] Foreign Application Priority Data

Feb. 14, 1990  [JP]  Japan  ................. 2-33367

[51] Int. Cl.$^6$ ................................. H01L 21/44
[52] U.S. Cl. ................. 438/268; 438/656; 438/665; 438/928; 438/977; 438/586
[58] Field of Search .................... 437/187, 974, 437/913, 234, 192, 228 ST, 225, 40 DM, 41 DM

[56] References Cited

U.S. PATENT DOCUMENTS

| | | |
|---|---|---|
| 4,859,629 | 8/1989 | Reardon et al. . |
| 4,879,250 | 11/1989 | Chan . |
| 4,927,784 | 5/1990 | Kazior et al. . |
| 4,931,412 | 6/1990 | Fischer et al. ........... 437/225 |
| 4,985,740 | 1/1991 | Shenai et al. . |
| 5,242,862 | 9/1993 | Okabe et al. ........... 437/225 |
| 5,338,961 | 8/1994 | Lidow et al. ........... 257/342 |

FOREIGN PATENT DOCUMENTS

| | | |
|---|---|---|
| 57-15420 | 1/1982 | Japan . |
| 57-015420 | 1/1982 | Japan . |
| 58-045814 | 10/1983 | Japan . |
| 58-45814 | 10/1983 | Japan . |
| 59-113629 | 6/1984 | Japan . |
| 59-189625 | 10/1984 | Japan . |
| 59-213140 | 12/1984 | Japan . |
| 59-220937 | 12/1984 | Japan . |
| 61-234041 | 10/1986 | Japan . |
| 61-296769 | 12/1986 | Japan . |
| 62-023170 | 1/1987 | Japan . |
| 62-23170 | 1/1987 | Japan . |
| 62-43123 | 2/1987 | Japan . |
| 62-243332 | 10/1987 | Japan . |
| 62-293678 | 12/1987 | Japan . |
| 63-253633 | 10/1988 | Japan . |
| 1-169970 | 7/1989 | Japan . |

OTHER PUBLICATIONS

Krishna Shenai et al, "A 50–V, 0.7mΩ•cm$^2$, Vertical–Power DMOSFET", IEEE Electron Device Letters, vol. 10, No. 3, Mar. 1989, pp. 101–103.

Krishna Shenai, "Optimally Scaled Low–Voltage Vertical Power Mosfet's for High–Frequency Power Conversion", IEEE Transactions on Electron Devices, vol. 37, No. 4, Apr. 1990, pp. 1411–1453.

(List continued on next page.)

Primary Examiner—George Fourson
Assistant Examiner—C. Everhart
Attorney, Agent, or Firm—Cushman, Darby & Cushman IP Group of Pillsbury Madison & Sutro LLP

[57] ABSTRACT

A semiconductor device including an N-type semiconductor substrate which includes arsenic as an impurity, a first electrode formed on a main surface of the N-type semiconductor substrate, a ground surface formed on another surface of the N-type semiconductor substrate, a second electrode formed on the ground surface and ohmically-contacted with the N-type semiconductor substrate, a semiconductor element formed in the N-type semiconductor substrate and flowing current between the first electrode and the second electrode during ON-state thereof. The device has a reduced ON-resistance thereof.

8 Claims, 8 Drawing Sheets

OTHER PUBLICATIONS

Shin-ichi Ogawa et al, "HRTEM and Nano-Scale Micro Analysis of the Titanium/Silicon Inter-Facial Reaction Correlated with Electrical Properties", Extended Abstracts of the 22nd 1990 International Conference on Solid State Devices and Materials, 1990, pp. 429–432.

C. Y. Ting et al, "The Use of Titanium-Based Contact Barrier Layres in Silicon Technology", Electronics and Optics, Thin Solid Films 96, 1982, pp. 327–345 (USA).

Krishna Shenai, "A 50-V, 0.7-m$\Omega$.cm$^2$ Vertical-Power DMOSFET", IEEE Elect. Device Letter, vol. No. 10. No. 3 Mar. 1989.

S. Ogawa et al, "HRTEM and Nano-Scale Micro Analysis of the Titanuim/Silicon Interfacial Reaction Correlated with Electrical Properties", Extended Abstract of the 22nd Conference.., 1990 pp. 429–432.

C.Y. Ting et al, "The Use of Titanium-based Contact Barrier Layers in Silicon Technology", Thin Solid Films, 96(1982) 327–345 Electronics and Optics.

Semiconductor Devices–Physics and Technology, Jan. 1985 S.M. Sze p. 307.

METHOD OF MANUFACTURING A VERTICAL SEMICONDUCTOR DEVICE WITH GROUND SURFACE PROVIDING A REDUCED ON RESISTANCE

This is a division of application Ser. No. 8/409,900 filed Mar. 22, 1995 which is a continuation of application Ser. No. 07/953,766 filed Sep. 30, 1992 now abandoned which was a division of application Ser. No. 07/652,920 filed Feb. 8, 1991 now U.S. Pat. No. 5,242,862.

BACKGROUND OF THE INVENTION

1. Field of the Invention

This invention relates to a semiconductor device which has a low ON-resistance, and further, to a method of manufacturing such a semiconductor device.

2. Description of the Related Art

Many kinds of methods of manufacturing for reducing an ON-resistance of a semiconductor device have been known. For example, Japanese Unexamined Patent Publication 1-169970 discloses a method in which an N-type impurity layer is formed in a back surface of a drain substrate so as to reduce a contact resistance between the drain substrate and a drain electrode. Japanese Examined Patent Publication 58-45814 discloses a method of manufacturing the semiconductor device which has a good ohmic contact between the drain substrate and the drain electrode. The device has a multilayer metal electrode on a back surface of a drain substrate. The multilayer metal electrode consists of layers having a gold layer as a main layer.

As shown in FIG. 13, the ON-resistance of a field effect transistor (FET) is represented by the following equation:

$$R_{ON} = R1 + R2 + R3 + R4 + R5 + R6 + R7 + R8 + R9 + R10$$

wherein, R1 denotes a contact resistance of a drain electrode 50; R2 denotes a contact resistance between the drain electrode 50 and an N-type impurity layer 52; R3 denotes a resistance of N drain substrate 54; R4, R5 and R6 denote resistances of N drain region 56 respectively; R7 denotes a resistance of P-type diffusion region 58 for forming a channel; R8 denotes a resistance of N-type source 60; R9 denotes a contact resistance between the N-Type source 60 and a source electrode 62; and R10 denotes a resistance of the source electrode 62.

However, such a conventional method of manufacturing the semiconductor device has many problems. For example, the method by which the N-Type impurity layer is formed is complex because an oxide film adhered to the back surface of the N drain substrate 54 and a diffusion layer having an opposite conductive type (P) to that of the N drain substrate 54 must be removed before the N-type impurity layer 52 is formed.

A semiconductor device for household use is demanded with a withstanding voltage more than 100 V, normally more than 200 V. It is a necessary to make a resistance of a epitaxial layer (the N drain region 56) formed on the N drain substrate 54 high to get the withstanding voltage. Therefore, the ratio of the resistance of the N drain substrate 54 to the resistance of the epitaxial layer becomes small. On the contrary, a semiconductor device for a motor vehicle is demanded with a withstanding voltage of at most 50–60 V. The resistance of the epitaxial layer is relatively low, and the ratio of the resistance of N drain substrate 54 to the resistance of the epitaxial layer becomes large. Therefore, in the semiconductor device for a motor vehicle, it is effective to reduce the resistance of the N drain substrate 54 for reducing the ON-resistance.

The resistance R3 of the N drain substrate 54 is represented by the following equation:

$$R3 = \rho_N \times t_n / S$$

wherein, $\rho_N$ denotes resistivity of the N drain substrate 54; $t_n$ denotes a thickness of the N drain substrate 54; and S denotes a cross section of the N drain substrate 54. It is necessary to reduce the thickness $t_n$ of the N drain substrate 54 so as to reduce this resistance R3. However, the thickness $t_n$ of the N drain substrate 54 for forming the N-type impurity layer 52 is determined in accordance with a thickness of a silicon wafer. The reason is that the N drain substrate 54 is warped by heat generated in a step that of large diameter, the thickness $t_n$ needs to be thick to the N-Type impurity layer 52 is formed when the thickness $t_n$ of the N drain substrate 54 is too thin. To get a wafer of large diameter, the thickness $t_n$ needs to be thick to keep the strength thereof. Therefore, the resistance R3 of the N drain substrate 54 becomes high, and thus the ON-resistance also becomes high.

The technique by which the concentration of antimony (Sb) as an impurity in the N drain substrate 54 is heightened and the resistivity is diminished, may be adopted so as to reduce the resistance R3 of the N drain substrate 54. However, it is impossible to make the resistance R3 less than 0.01 Ω·cm because of the limitation of the amount solution of Sb which can be in the solution.

Moreover, since it is impossible to make the impurity concentration in the substrate high because of the limitation of solution, it is difficult to get a good ohmic contact between an N-type substrate and an electrode.

On the other hand, in the method which utilizes gold as an electrode material, the barrier height of the gold for an P-type silicon substrate is 0.2 eV, and therefore so a good ohmic contact between those can be obtained. However, since the barrier height of the gold for an N-type silicon substrate is relatively high, 0.8 eV, the contact between those becomes a schottky contact and may have undesirable diode character.

Moreover, when an overall thickness is thick, stress from a package becomes larger, and further the difference between of height of a lead frame and a height of the source electrode 62 becomes larger. Therefore, the wire bonding work becomes very difficult. Also, the cost of gold is very high.

Techniques other than the aforementioned techniques have also been known. The technique which is disclosed in Japanese Unexamined Patent Publication 57-15420 suggests that a back surface of a silicon substrate is ground to improve adherence between the back surface and a collector electrode formed on the back surface. The technique which is disclosed in "IEEE ELECTRON DEVICE LETTERS, VOL. 10, NO. 3 MARCH 1989, P101–103" suggests that a 0.004 Ω·cm arsenic-doped silicon substrate is used.

SUMMARY OF THE INVENTION

An object of this invention is to reduce the ON-resistance of a semiconductor device.

Another object of this invention is to get a good ohmic contact.

A still further object of this invention is to provide a thin semiconductor device having the advantage of small stress from a package and easy wire bonding.

To accomplish the above objects, a semiconductor device according to this invention includes an N-type semiconductor substrate including arsenic as an impurity and having a ground surface formed on one surface thereof, said ground surface having concavo-convex irregularities, a first electrode formed on another surface other than said one surface of said N-type semiconductor substrate, a second electrode formed on said ground surface and ohmically contacted with said N-type semiconductor substrate through said ground surface, and a semiconductor element formed in said N-type semiconductor substrate and in which an electric current flows between said first electrode and said second electrode during an ON-state thereof.

DESCRIPTION OF THE PREFERRED EMBODIMENTS

The preferred embodiments of this invention will be described with reference to the drawings. The embodiments are suitable for a semiconductor device for a motor vehicle.

Figure 1:
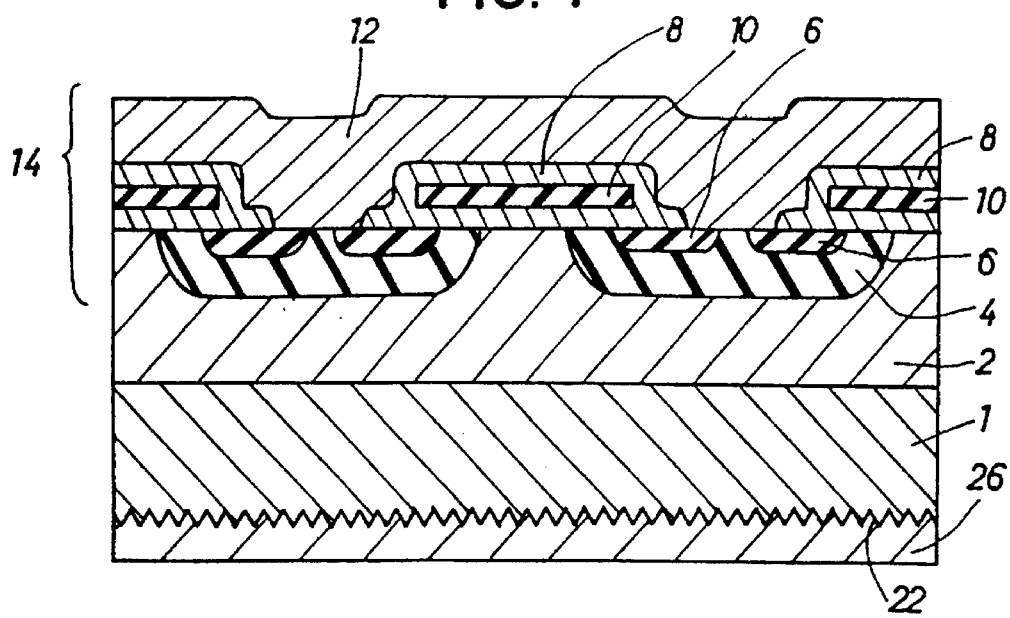
FIG. 1 is a sectional view of a semiconductor device of this invention.

FIG. 1 shows an N-type drain region 2 formed on a silicon substrate 1 which is doped with As (arsenic) formed by crystallizing melted silicon that has As therein. A P-type region 4 is formed in the N-type drain region 2 for forming a channel. An N-type source region 6 is formed in the P-type region 4. A polycrystalline silicon gate 10 is formed on the N-type drain region 2 and the P-type region 4 through an oxide film (SiO$_2$) 8. A source electrode 12 is formed on the oxide film 8 and electrically connected with the P-type region 4 and the N-type source region 6. An ohmic electrode 26 is formed on a ground surface 22 which is formed on a back surface of the silicon substrate 1.

Here, the prior art used Sb (antimony) as an N-type impurity. However, the concentration of Sb could not be more than $5 \times 10^{18}$ cm$^{-3}$ owing to its limitation of solution.

The inventors have solved this problem by including As in the silicon substrate 1 as the N-type impurity. As has a higher limitation of solution than Sb and therefore solves this problem. The concentration of As is set within a range between $7 \times 10^{18}$ cm$^{-3}$–$1 \times 10^{21}$ cm$^{-3}$ Therefore, the contact resistance between the silicon substrate 1 and the ohmic electrode 26 can be reduced sufficient to avoid a schottky contact and get an ohmic contact. Since the concentration of As is more than $7 \times 10^{18}$ cm$^{-3}$, a good ohmic contact can be obtained for almost all electrode materials. Moreover, the resistivity of the silicon substrate 1 is also diminished because of the higher concentration of As included in the silicon substrate 1 as an impurity. Consequently, the resistance R3 of the silicon substrate 1 is also reduced. The ground surface 22 has been ground to have a concavo-convex surface which has many coarse surface irregularities. Therefore, the ohmic electrode 26 can be firmly adhered to the ground surface 22 because the ground surface 22 has a suitable concavo-convex surface.

Figure 2A:
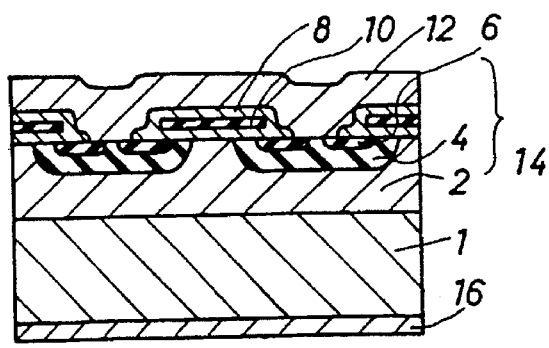
FIGS. 2A–2C are sectional views showing the sequence of processes of the semiconductor device of this invention.
Figure 2B:
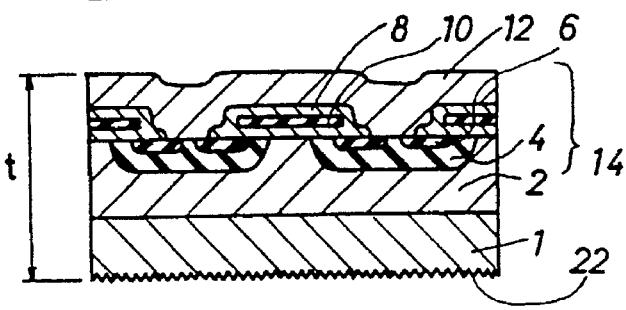
Figure 2C:
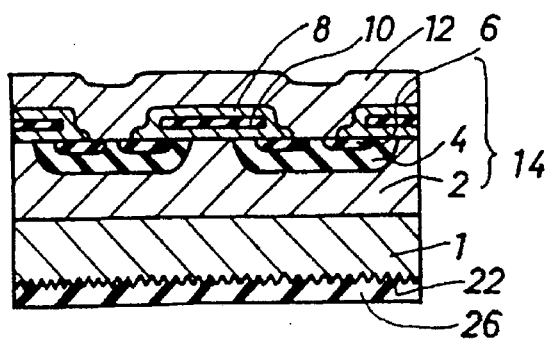

The process of forming the aforementioned semiconductor device of the embodiment of this invention will now be described with reference to FIGS. 2A–2C. FIGS. 2A–2C show the sequence of the process. A silicon crystal is formed by a CZ (Czochralski) method, where As is added as a dopant in a melted silicon. The silicon substrate 1 is formed by slicing the silicon crystal. Therefore the silicon substrate 1 has As a solid solution, the concentration of As being $7 \times 10^{18}$ to $1 \times 10^{21}$ cm$^{-3}$, and resistivity of the silicon wafer is less than 0.008 Ω·cm. FIG. 2A shows the N-type drain region 2 having P (phosphorus) as an impurity and being grown on a main surface of the silicon substrate 1 by an epitaxial growth method. The oxide film (SiO$_2$) 8 is formed on a surface of the N-type drain region 2. The polycrystalline silicon is deposited on the oxide film 8 by an LPCVD (low pressure chemical vapor deposition) technique. P (phosphorus) is introduced in the polycrystalline silicon, and the polycrystalline silicon is locally etched to form the polycrystalline silicon gate 10. The polycrystalline silicon gate 10 is oxidized, and P-type impurities such as B (boron), Al (aluminium), Ga (gallium) or the like are diffused into the N-type drain region 2 by using this polycrystalline silicon gate 10 as a mask for forming the P-type region 4. A portion of the P-type region 4 becomes a channel region. The N-type source region 6 is formed by locally diffusing N-type impurities such as As, P (phosphorus) or the like into the P-type region 4. Windows are then opened in the oxide film 8 and Al-Si is deposited by a sputtering method for forming the source electrode 12, so that the source electrode 12 is connected to both the P-type region 4 and the N-type source region 6. Here, a device layer 14 consists of the P-type region 4, the N-type source region 6, the oxide film 8, the polycrystalline silicon gate 10, and the source electrode 12. Moreover, a passivation film such as a plasma-SiN or the like may be formed on the source electrode 12 for stabilizing a surface of the device layer 14.

Figure 3:
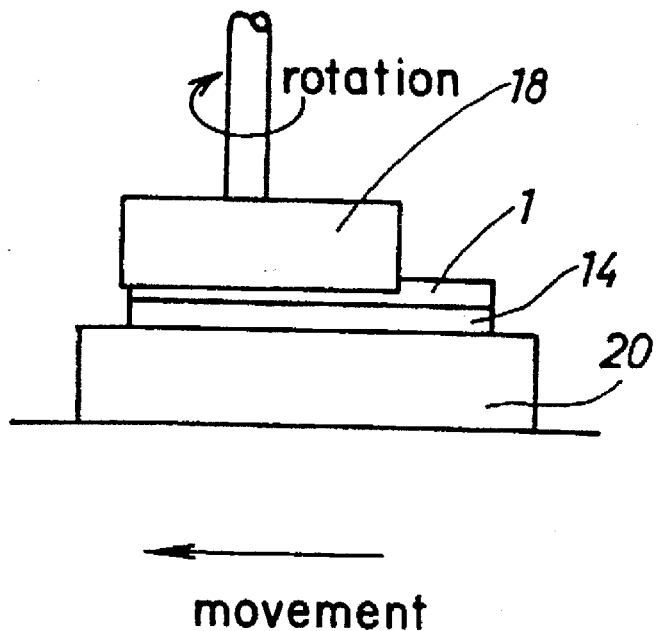
FIG. 3 is a side view for explaining a surface grinding proceeding.

During this process, a by-product layer 16, such as a polycrystalline silicon, a silicon oxide (SiO$_2$) or the like, is spontaneously formed on another (back) surface of the silicon substrate 1 while the aforementioned device is being manufactured. The another surface of the silicon substrate 1 on which the by-product layer 16 is formed thereon is ground by a surface grinding (SG) proceeding for removing the by-product layer 16. The surface grinding is carried out by using a grindstone 18 as shown in FIG. 3. The granularity of the grindstone 18 is between No. 300–No. 500. In this embodiment, a surface of the device layer 14 is covered with a adhesive film (not shown) and the device layer 14 is fixed by a vacuum chuck 20.

FIG. 2B shows the by-product layer 16 removed by the grinding, and a ground surface 22 being formed. In this condition, the thickness t from one surface of the device layer 14 to the another surface of the silicon substrate 1 is 200–450 μm. After grinding, the whole device is washed by super pure water.

Figure 5:
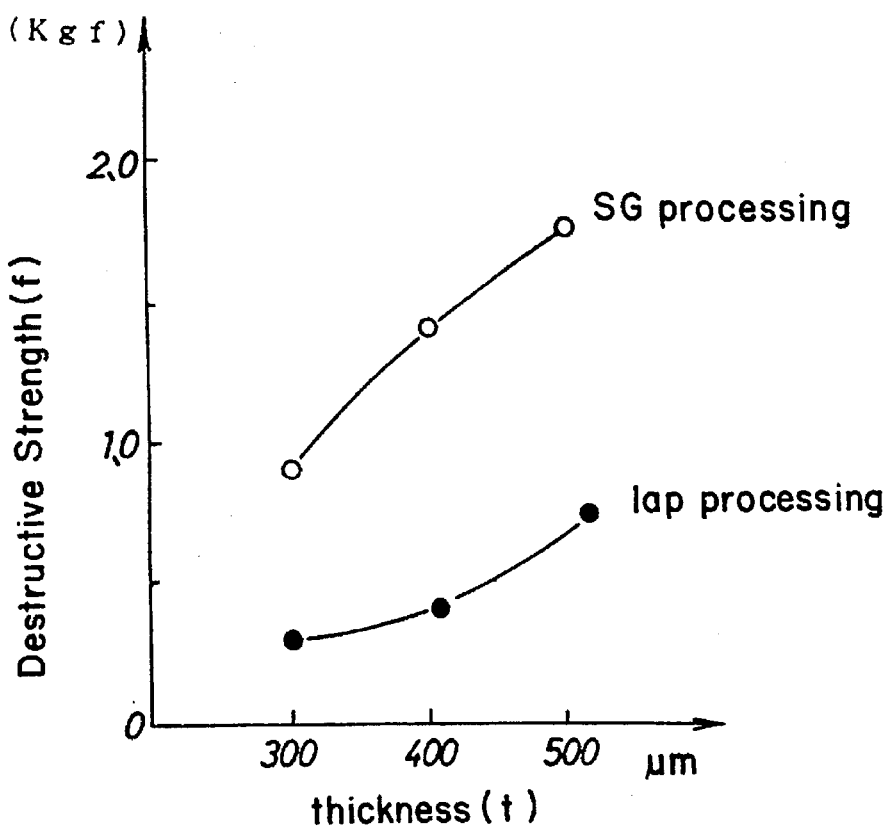
FIG. 5 shows a relationship between the thickness t and destructive strength.
Figure 6:
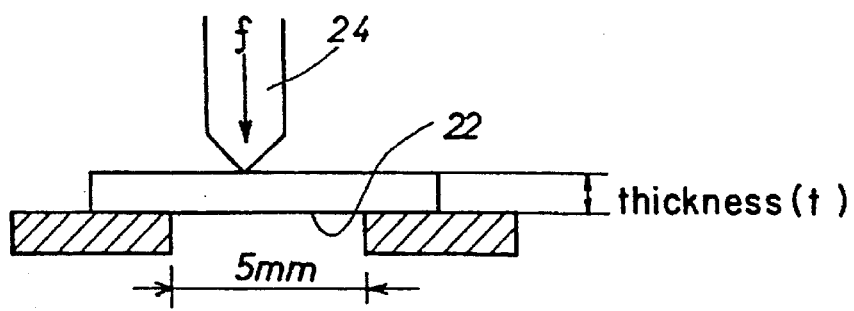
FIG. 6 is a sectional view for explaining a load test.

The silicon crystal of the another surface of the silicon substrate 1 is damaged by the grinding. This damage destroys some part of the crystalline structure of the silicon substrate, and should therefore be avoided. It also decreases the destruction strength. However, the depth of this damaged layer is only 1–2 μm if the surface grinding device of FIG. 3 is used. FIG. 5 shows a graph of depth of the damaged layer. Because the depth of the damaged layer is shallow, the destruction strength of this device is still between 1.0–1.6 kg. FIG. 6 shows a load test where the destruction strength is defined as a maximum load when a chip destroyed. The load test is carried out in such a way that the center of the chip is supported at its both ends and has a load applied thereon by a load piece 24.

Figure 4:
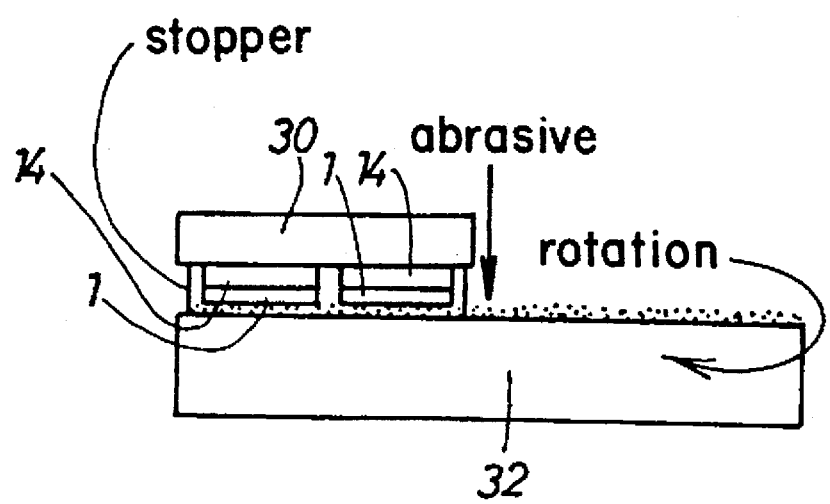
FIG. 4 is a side view for explaining a lapping grinding proceeding.

If the another surface of the silicon substrate 1 is ground by lapping grinding instead of surface grinding, the depth of the damaged layer is 6–7 μm, and the destruction strength of this device becomes 0.3–0.6 kg (shown in FIG. 5). FIG. 4 shows the lapping grinding is carried out in the condition which the device is fixed on upper surface plate 30 by paraffin glue and abrasives (a mix of abrasives No. 800 and No. 1200 of SiC) are supplied between the device and a lower surface plate 32. As understood by comparing the two lines in FIG. 5, surface grinding will make the destruction strength stronger than lapping grinding.

Figure 7:
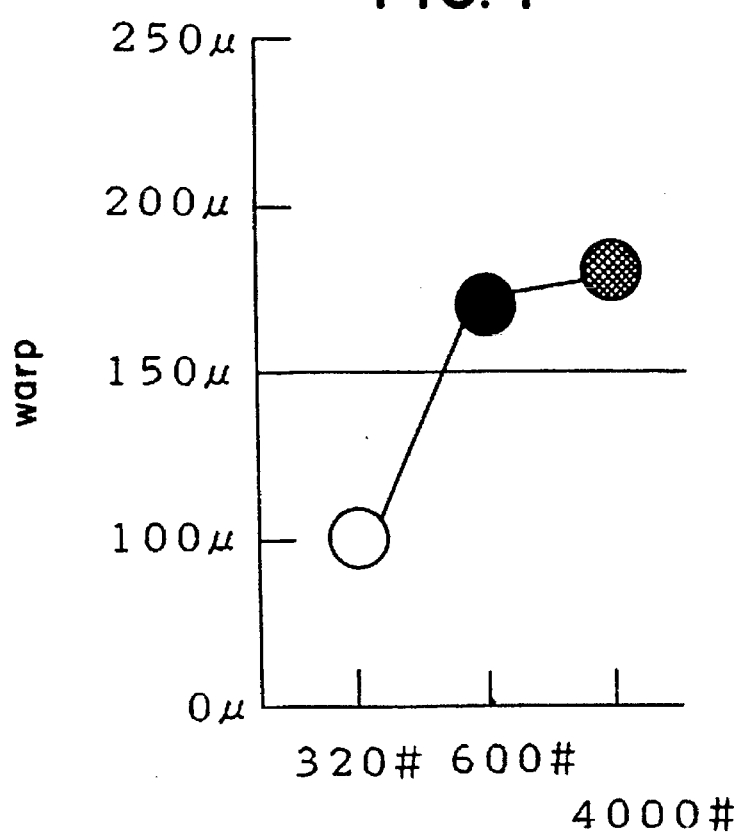
FIG. 7 shows a relationship between the granularity of a grindstone and warp of the silicon substrate.

FIG. 7 shows that when the granularity of the grindstone 18 is No. 300–No. 500, the warping of the silicon substrate 1 can be reduced. If the granularity is finer than No. 500, however the warp becomes larger. If the granularity is coarser than No. 300, the silicon substrate 1 is easily broken.

The reason why the warping is reduce is that the coarser the granularity is, the more stress in the silicon substrate is dispersed.

Figure 14:
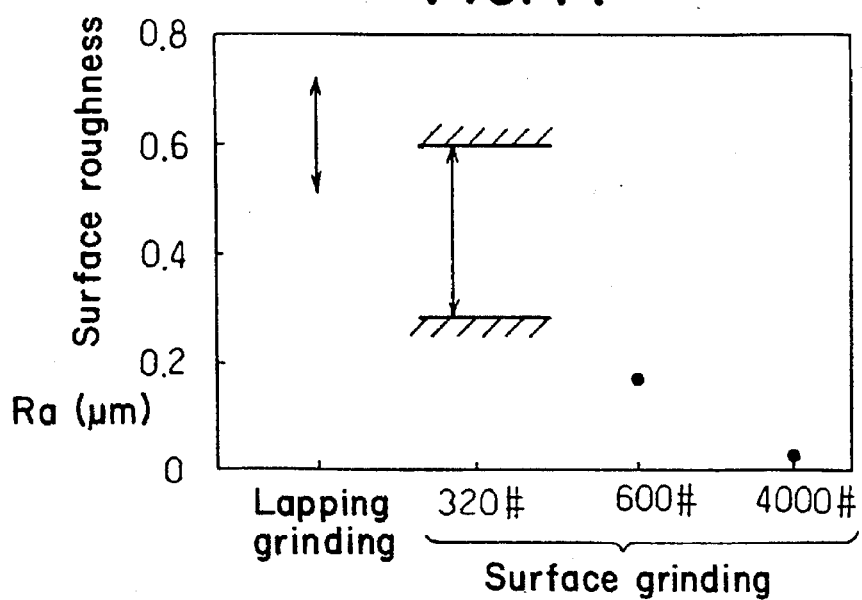
FIG. 14 shows a relationship between the granularity and surface roughness.

FIG. 14 shows a relationship between the granularity of the grindstone 18 and surface roughness Ra. When the granularity is No. 320, the surface roughness Ra is in a range between 0.3–0.6 μm. When the granularity is No. 600, the surface roughness Ra is almost 0.2 μm. When the granularity is No. 4000, the surface roughness Ra becomes almost 0 μm. It is to be noted that surface roughness Ra of the silicon substrate 1 which is polished up is also almost 0 μm.

Figure 15:
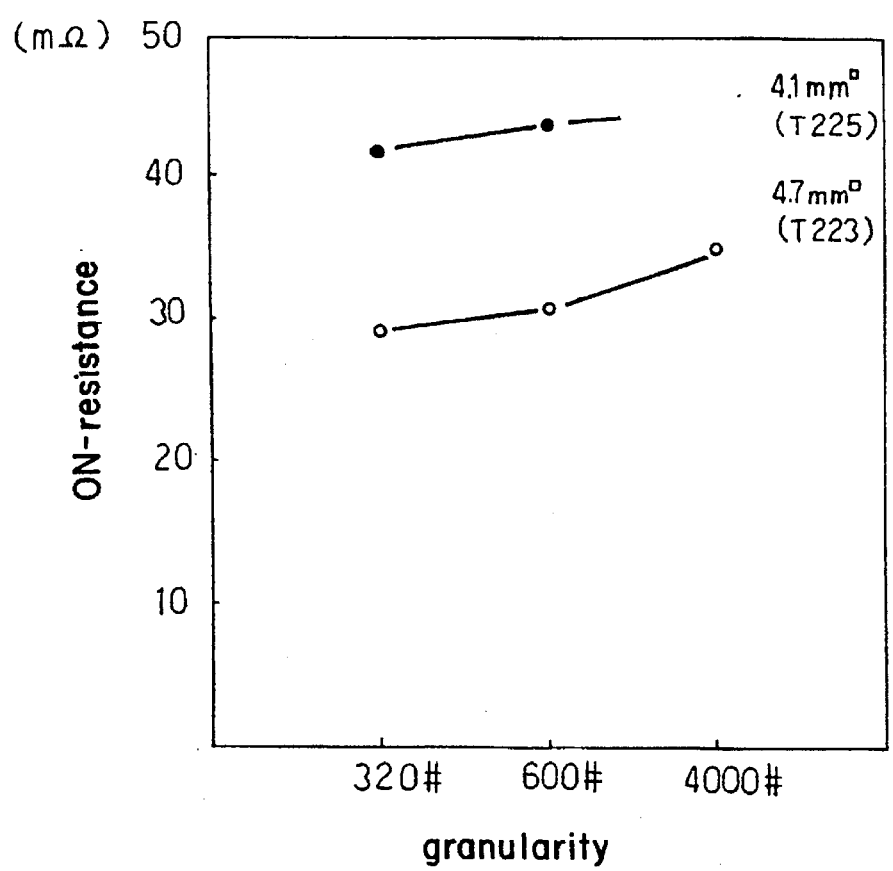
FIG. 15 shows a relationship between the granularity and an ON-resistance.

FIG. 15 shows a relationship between the granularity of the grindstone 18 and an ON-resistance. As shown in FIG. 15, when the granularity is coarser, the ON-resistance becomes low. The reason is that when the granularity is coarser, barrier height of the ohmic electrode 26 for the silicon substrate 1 becomes low, and the contact resistance between the ohmic electrode 26 and the silicon substrate 1 becomes low. It is desirable that the granularity is a range between No. 320–No. 600 to reduce the ON-resistance.

Figure 8:
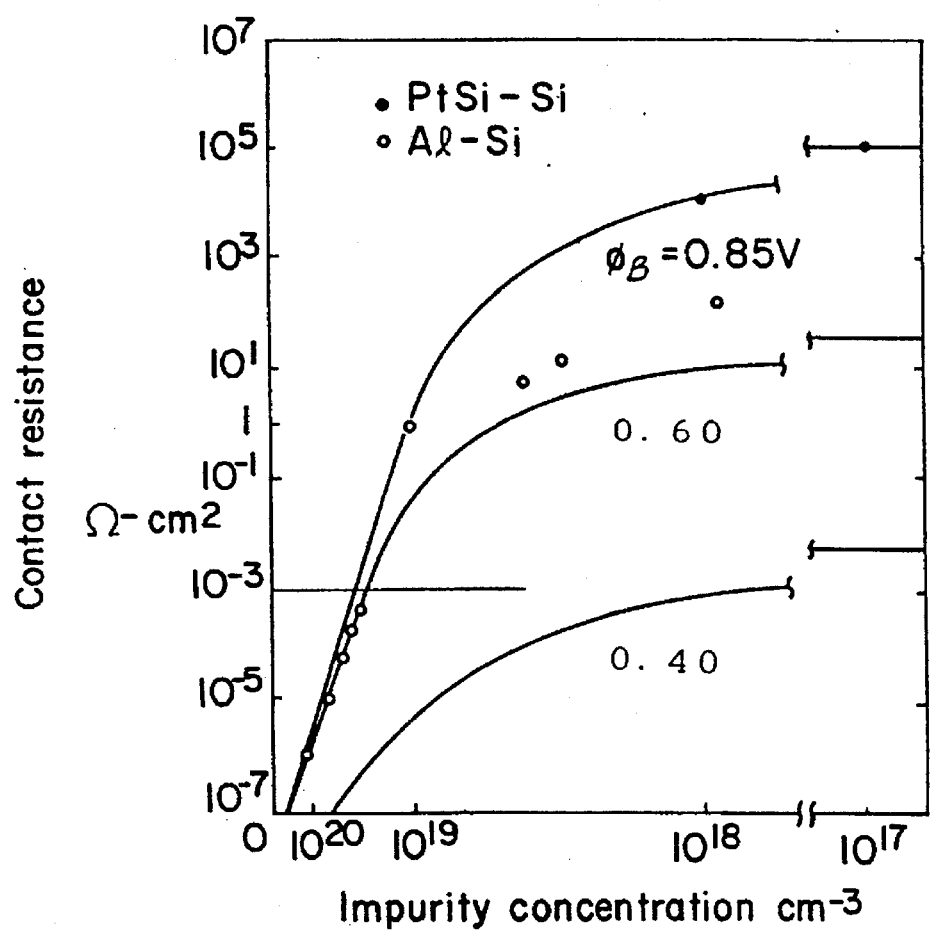
FIG. 8 shows a relationship between the impurity concentration and the contact resistance.
Figure 13:
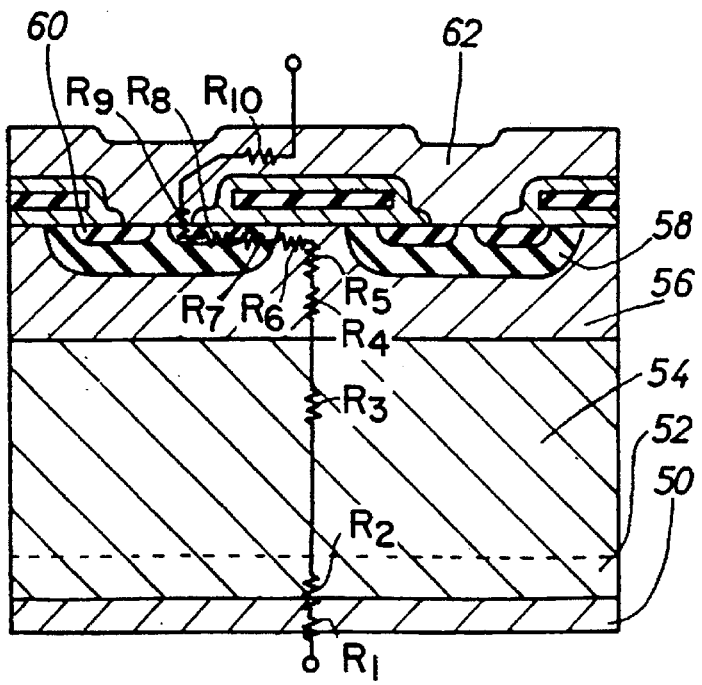
FIG. 13 is a sectional view of a semiconductor device of the prior art.

FIG. 2C shows that after the spontaneously formed by product layer 16 (not shown) has been removed by a wet etching or an RF etching, and an ohmic electrode 26 is formed on the ground surface 22 by a sputtering method. The ohmic electrode 26 acts as a drain electrode. In this embodiment, the ohmic electrode 26 is a multilayer electrode consisting of Ti-Ni-Au layers. When electrode material, such as Ti (titanium), V (vanadium), Cr (chromium), Ni (nickel) or the like, is adopted, it is necessary to make an impurity concentration in the silicon substrate 1 more than $5 \times 10^{18}$ cm$^{-3}$, preferably, more than $7 \times 10^{18}$ cm$^{-3}$ so as to make an ohmic contact with the electrode material. The barrier height $\Phi_B$ of the electrode material for silicon is 0.4–0.6 eV. As shown in FIG. 8, if the impurity concentration is more than $5 \times 10^{18}$ cm$^{-3}$, the contact resistance between the electrode material and the silicon substrate 1 begins to rapidly be reduced, and if the impurity concentration is more than $7 \times 10^{18}$ cm$^{-3}$, the contact resistance becomes less than $10^{-3}$ Ω·cm$^2$.

Figure 9:
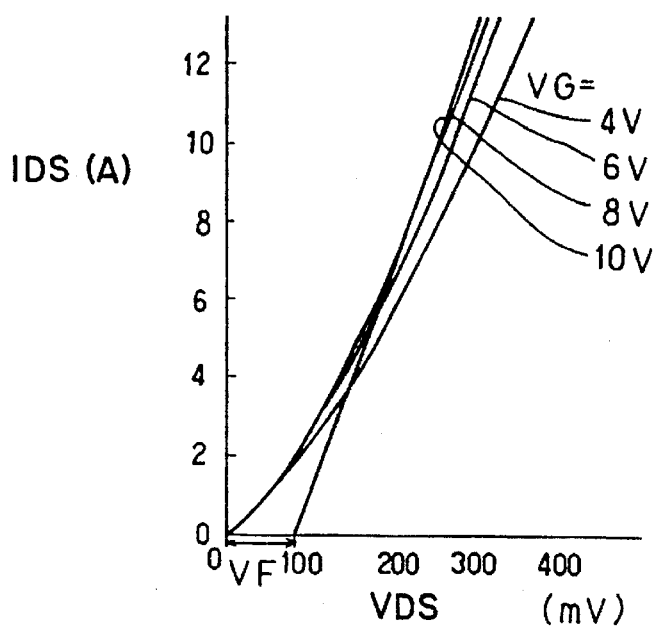
FIG. 9 shows a relationship between $V_{DS}$ and $I_{DS}$ of power MOS FET.

FIG. 9 shows a relationship between $V_{DS}$ (voltage between the source and the drain) and $I_{DS}$ (current between the source and drain) of this power MOS FET. Voltage of the gate $V_G$ is a parameter of the relationship. A shifted voltage $V_F$ in linearity of $V_{DS-IDS}$ is calculated and is used as an index so as to judge whether the contact is a schottky contact.

Figure 10:
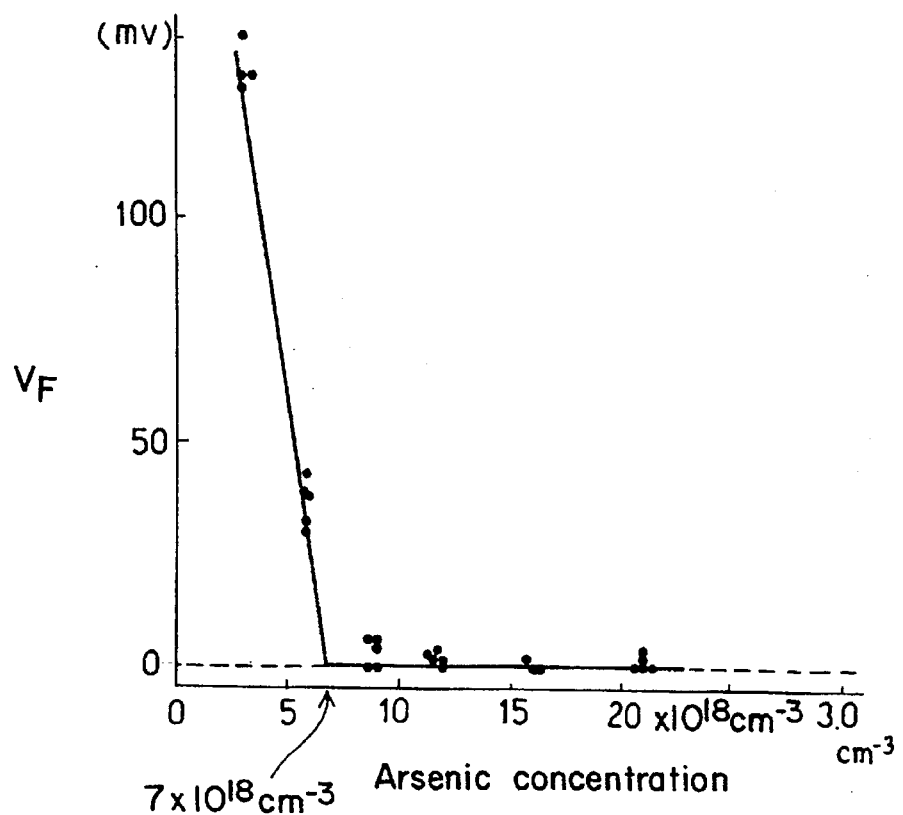
FIG. 10 shows a relationship between $V_F$ and the concentration of As in the silicon substrate.

FIG. 10 shows a relationship between this calculated $V_F$ and a concentration of As in the silicon substrate 1. As shown in FIG. 10, when the concentration of As is more than $7 \times 10^{18}$ cm$^{-3}$, $V_F$ becomes substantially 0(zero) and the contact is an ohmic contact.

The upper limitation of the concentration of As which is included in the silicon substrate 1 is its limitation of solution. This limitation is found by measuring the value of leakage current through the P-N junction.

Figure 11:
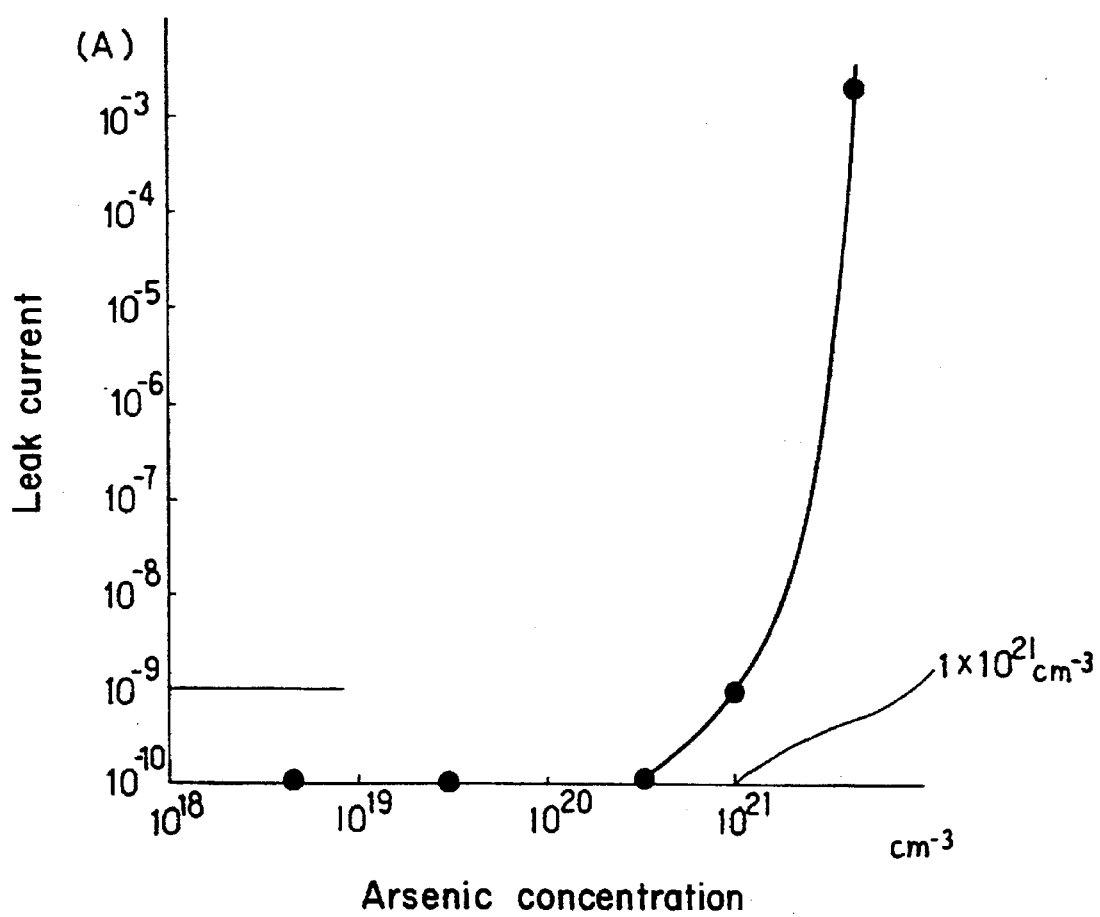
FIG. 11 shows a relationship between the concentration of As and the value of the leak current.

FIG. 11 shows a relationship between the concentration of As and the value of the leakage current through the P-N junction. Before the value of the leakage current is measured, to form P-N junction, a P-type impurity such as B (boron) or the like is diffused in an N-type silicon substrate including As as an impurity. When the concentration of As is higher than its limitation of solution, the crystallinity of silicon is disordered and leakage current flows through the P-N junction. Therefore, the concentration when the leakage current begins to flow is defined as the value of its limitation of solution. As shown in FIG. 11, the limitation of solution is $1 \times 10^{21}$ cm$^{-3}$.

Figure 12:
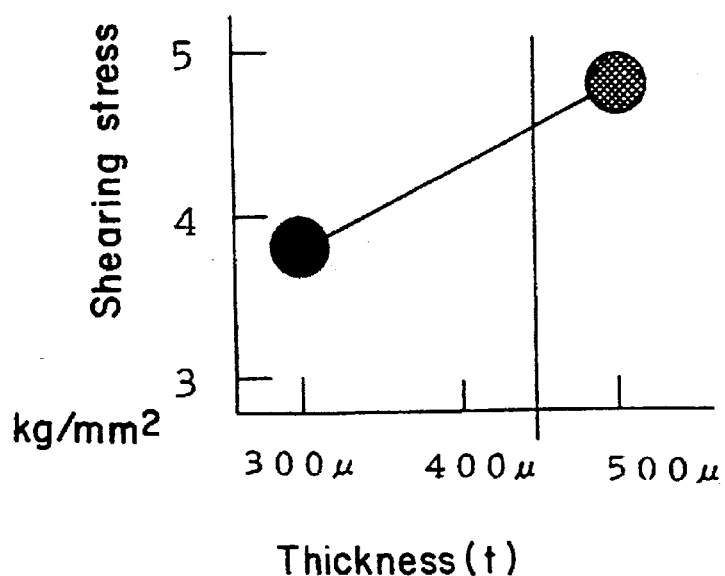
FIG. 12 shows a relationship between the thickness t and shearing stress.

The chip which was manufactured by abovementioned manufacturing steps is molded by silicone resin, and an IC package is formed. In this molding step, because a thickness of the chip is thin, as shown in FIG. 12, the shearing stress becomes low. Consequently, the stress of the IC package is relaxed. Moreover, when a lead frame (not shown) is bonded to the source electrode 12 with a wire, the wire-bonding work becomes easy because the height of the lead frame and the source electrode 12 are similar.

The present invention has been described with reference to the abovementioned embodiment, but the present invention is not limited to this embodiment and can be modified without departing from the spirit or concept of the present invention. For example, the present invention may be applied to an IGBT (Insulated Gate Bipolar Transistor), SIT (Static Induction Transistor), SI (State Induction) thyristor or the like other than the power MOSFET. These semiconductor elements flow current in a vertical direction (a direction of a thickness of a substrate) and an electrode formed on N-type silicon substrate.

What is claimed is:

1. A method of manufacturing a semiconductor device comprising steps of:

preparing an N-type semiconductor wafer to have a thickness and an N-type substrate including arsenic as an impurity;

growing an N-type epitaxial layer including phosphorus as an impurity on said N-type substrate;

forming a semiconductor element in said N-type epitaxial layer, said semiconductor element being capable of flowing an electric current in a direction of said thickness of said N-type semiconductor wafer;

forming a first electrode on a first surface of said N-type semiconductor wafer; then grinding a second surface of said N-type semiconductor wafer to remove a by-product layer formed on said second surface of said N-type semiconductor wafer during said step of forming said semiconductor element and to roughen said second surface of said N-type semiconductor wafer, whereby an exposed surface of said N-type substrate is roughened; and then forming a second electrode including at least one material selected from a group consisting of titanium (Ti), vanadium (V), chromium (Cr) and nickel (Ni) on said ground second surface of said N-type semiconductor wafer so that said second electrode ohmically-contacts said ground second surface of said N-type substrate.

2. A method of manufacturing a semiconductor device according to claim 1, wherein:

said step of preparing said N-type semiconductor wafer includes preparation of said N-type semiconductor substrate including arsenic to have a resistivity of less than 0.008 $\Omega$·cm.

3. A method of manufacturing a semiconductor device according to claim 1, wherein:

said step of grinding said second surface includes grinding said second surface of said N-type semiconductor wafer until a thickness from a surface of said first electrode to said ground second surface is 200–450 µm.

4. A method of manufacturing a semiconductor device according to claim 1, wherein:

said step of forming said semiconductor element includes forming a MOSFET in said N-type epitaxial layer, said first electrode being a source electrode of said MOSFET; and said step of forming said second electrode forms said second electrode as a drain electrode of said MOSFET.

5. A method of manufacturing a semiconductor device according to claim 4, wherein:

said second electrode is formed as a multilayer electrode comprising Ti-Ni-Au.

6. A method of manufacturing a semiconductor device according to claim 1, wherein:

said step of grinding said second surface includes grinding said second surface of said N-type semiconductor wafer by a surface grinding process.

7. A method of manufacturing a semiconductor device according to claim 6, wherein:

said step of grinding said second surface includes grinding said second surface of said N-type semiconductor wafer by using a grindstone having a granularity of between No. 300–No. 500.

8. A method of manufacturing a semiconductor device according to claim 1, wherein:

said step of grinding said second surface includes grinding said second surface of said N-type semiconductor wafer to reduce said thickness of said N-type semiconductor wafer and to form concavo-convex irregularities on said ground second surface.

* * * * *